(12) United States Patent
Makiura

(10) Patent No.: US 7,768,197 B2
(45) Date of Patent: Aug. 3, 2010

(54) ELECTROLUMINESCENCE DEVICE, AN ELECTRONIC EQUIPMENT, AND METHODS OF MANUFACTURING THE SAME

(75) Inventor: Rie Makiura, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 418 days.

(21) Appl. No.: 11/470,726

(22) Filed: Sep. 7, 2006

(65) Prior Publication Data

US 2007/0090752 A1 Apr. 26, 2007

(30) Foreign Application Priority Data

Oct. 26, 2005 (JP) .............................. 2005-311454

(51) Int. Cl.
*H05B 33/14* (2006.01)
*H05B 33/00* (2006.01)

(52) U.S. Cl. ................... 313/506; 313/504; 428/690; 428/917

(58) Field of Classification Search ......... 313/504–506; 428/690, 917
See application file for complete search history.

(56) References Cited

U.S. PATENT DOCUMENTS 6,208,075 B1 * 3/2001 Hung et al. ................. 313/504
7,247,886 B2   7/2007 Mizuno et al.
2002/0101154 A1 * 8/2002 Seo et al. ................... 313/506
2002/0155319 A1 * 10/2002 Kawamura et al. .......... 428/690
2006/0226770 A1 * 10/2006 Lee et al. .................... 313/504
2007/0243651 A1   10/2007 Mizuno et al.

FOREIGN PATENT DOCUMENTS

| JP | A 9-17574 | 1/1997 |
| JP | A 11-162646 | 6/1999 |
| JP | A-2005-079064 | 3/2005 |
| JP | A-2005-093279 | 4/2005 |

OTHER PUBLICATIONS

L.S. Hung et al., "Enhanced electron injection in organic electroluminescence devices using an Al/LiF electrode," Appl. Phys. Lett., vol. 70, No. 2, pp. 152-154, Jan. 13, 1997.

* cited by examiner

*Primary Examiner*—Sikha Roy
(74) *Attorney, Agent, or Firm*—Oliff & Berridge, PLC

(57) ABSTRACT

An electroluminescence device having a positive electrode, a negative electrode, a luminescent layer, and a buffer layer. The luminescent layer is disposed between the positive electrode and the negative electrode. The buffer layer is disposed between the luminescent layer and the negative electrode, where the buffer layer is a plasma polymerized film made of a gas material and having an average thickness of equal to or less than 30 Å.

6 Claims, 7 Drawing Sheets

ELECTROLUMINESCENCE DEVICE, AN ELECTRONIC EQUIPMENT, AND METHODS OF MANUFACTURING THE SAME

BACKGROUND

1. Technical Field

The present invention relates to an electroluminescence device, an electronic equipment and manufacturing methods thereof.

2. Related Art

Generally, an organic electroluminescence element, which is hereinafter referred to as the "organic EL element" and which composes the organic electroluminescence device, includes, for example, a first electrode or a positive electrode and a second electrode or a negative electrode, between which an organic luminescent material is laminated. Electrons and holes charged from the above stated both electrodes recombine within the luminescent layer to allow the excited energy to be discharged in the form of light emission.

In such an organic EL device, it is material to pay an attention to a possible existence of a charge injection barrier between each electrode and a luminescent layer. Tang et al. teach to utilize magnesium (Mg) having small work function in order to lower an energy barrier which disturbs an injection of electrons from the negative electrode. A technical literature Appl. Phys. Lett., 51,913 (1987) is an example of related art. In the technical literature, since Mg is apt to be oxidized and unstable in the atmosphere, Mg is alloyed by coevaporation with Ag which is relatively stable. Alternatively, calcium (Ca) is often used for the reason of the small work function. Here, a covering film made of aluminum (Al) or the like is employed as a protection layer.

Another examples of related art are L. S. Hung, C. W. Tang, and M. G. Mason, Appl. Phys. Lett. 70,152 (1997) and JP-A-09-17574. Those examples of related art report that a thin film made of alkali metal such as LiF and MgO or halogenized or oxidized alkali earth metal is inserted between the negative electrode and the organic layer in order to produce a high efficiency.

Further example of related art is JP-A-11-162646. This example of related art reports that use of a metal complex of the alkali metal or the alkali earth metal in the form of the electron injection layer will provide the organic EL element having a high light emission efficiency.

When a chemical compound of the alkali metal or the like having low work function is inserted to serve as the electron injection layer between the organic layer and the negative electrode, it is said that a factor which produces the effect of the high efficiency is a reducing reaction or a vacuum level shift upon deposition of the negative electrode. With regard to the reducing reaction, it is considered that, since an attempt of enhancement of the characteristic resembles to an attempt of the work function of the metal composing the chemical compound, a metallic compound is reduced to a status of metal upon deposition of the negative electrode such as Al, thereby improving the electron injection characteristic.

SUMMARY

It is concerned that the metal or metal ion may be diffused within the organic layer to invite an optical quenching in the cases where a low work function metal is used for the negative electrode or where a low work function metallic compound is used for the electron injection layer. There is another concern that those chemical compounds require a careful treatment at a time of or after forming a film since many of those chemical compounds have an abundance of hygroscopic property and a deliquescence property.

An advantage of the invention is to resolve the above mentioned problems and to provide the organic EL device capable of securing a stability in driving.

Another advantage of the invention is to provide the electronic equipment having a good light emitting property.

According to an aspect of the invention, a method of manufacturing the organic electroluminescence device includes a process for forming the positive electrode on the substrate, a process for forming the luminescent layer on the positive electrode, a process for forming the buffer layer on the luminescent layer and a process for forming the negative electrode on the buffer layer, in which the buffer layer is formed by means of plasma polymerization using gas material.

The above stated method enables to form a thin film or the buffer layer on the luminescent layer in a precise manner. That is, the above stated method is capable of preventing metal or metal ion used for the negative electrode from being diffused within the luminescent layer as well as capable of improving the stability in driving.

In the above stated method of manufacturing the organic electroluminescence device, the luminescent layer may be formed by a liquid droplet ejection device which ejects a liquid material.

In the above stated method of manufacturing the organic electroluminescence device, it is preferable that the gas material includes fluorosis. More specifically, the gas material is preferred to include fluorocarbon. Here, the fluorocarbon is a gas including structural elements of fluorine and carbon, and may further including elements other than the fluorine and the carbon, e.g., hydrogen (H) and nitrogen (N) or the like. Thus obtained polymerized film is excellent at a hygroscopic resistance property.

In the above stated method of manufacturing the organic electroluminescence device, it is preferable that the buffer layer has a film thickness of equal to or less than 30 Å. If the film thickness of the buffer layer is equal to or more than 30 Å, a conductivity of the film in a direction of laminating layers lowers remarkably and a driving voltage of the element rises.

In the above stated method of manufacturing the organic electroluminescence device, it is preferable that the positive electrode is a transparent electrode.

According to another aspect of the invention, the method of manufacturing the organic electroluminescence device may include a process for forming a plurality of positive electrodes on the substrate, a process for forming banks for separating the plurality of positive electrodes to each other, a process for forming a plurality of luminescent layers on the plurality of positive electrodes, a process for forming a buffer layer on the plurality of luminescent layers and the banks, and a process for forming a negative electrode on the buffer layer, in which the buffer layer is formed by plasma polymerization using gas material.

According to a further aspect of the invention, the method of manufacturing the organic electroluminescence device may include a process for forming a plurality of positive electrodes on the substrate, a process for forming banks for separating the plurality of positive electrodes to each other, a process for forming a plurality of luminescent layers on the plurality of positive electrodes, a process for forming a plurality of buffer layers which are separated by the banks on the plurality of luminescent layers, and a process of forming a negative electrode on the plurality of buffer layers and the banks, in which the buffer layers are formed by plasma polymerization using gas material.

In the above stated method of manufacturing the organic electroluminescence device, it is preferable that the process for forming separating walls or the banks includes a process for forming inorganic banks composed of inorganic materials on the substrate and a process for forming organic banks composed of organic materials on the inorganic banks.

According to a still further aspect of the invention, it is preferable for the organic electroluminescence device to include an positive electrode, a negative electrode, a luminescent layer positioned between the positive electrode and the negative electrode, and a buffer layer positioned between the luminescent layer and the negative electrode, in which the buffer layer is a plasma polymerized film made of gas material. This organic electroluminescence device preferably includes an electron injection layer between the negative electrode and the buffer layer.

According to still further aspect of the invention, the electronic equipment includes the above stated organic electroluminescence device, which is hereinafter referred to as the "organic EL device". Such structure can provide the electronic equipment having a good light emitting property.

DESCRIPTION OF EXEMPLARY EMBODIMENTS

Figure 1:
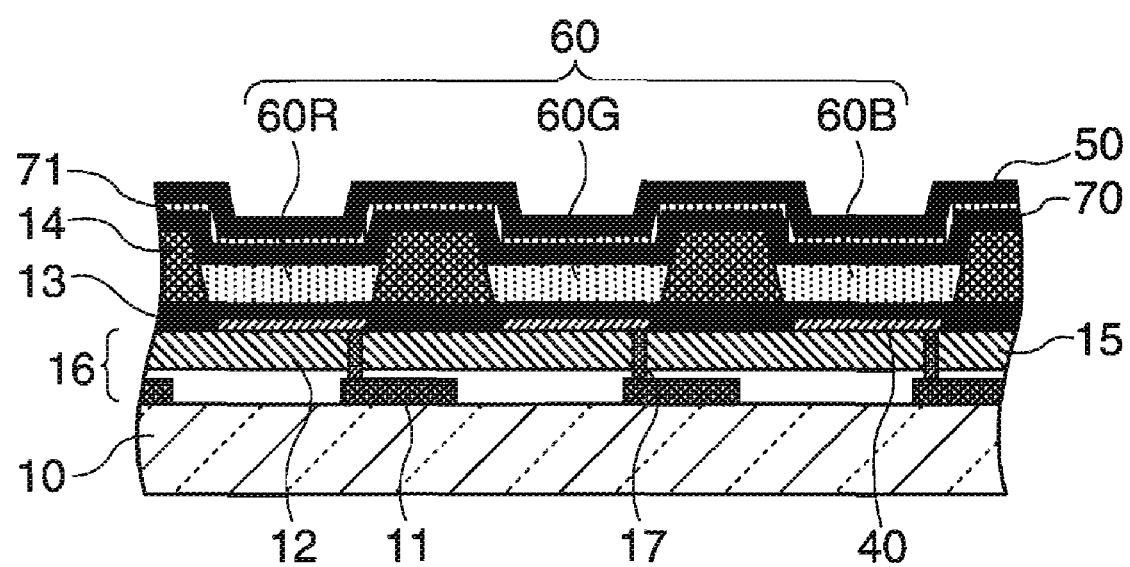
FIG. 1 is a cross sectional view illustrating an organic EL device manufactured by a method according to a first embodiment of the invention.

The invention is described hereinafter into details. The embodiments described hereinafter are just examples of the invention, and thus do not limit the scope of the invention. Modifications and developments of these embodiments can be arbitrary made as far as the modifications and the developments would not depart from the technical idea of the invention. In the drawings as attached hereto, layers and members are arbitrary changed of their scales one by one in order for the layers and the members to be visible on the drawings.

The embodiments of the invention are explained hereinafter, referring to the drawings attached hereto. Here, an organic EL device is used as a display device for the exemplary sake.

A method of manufacturing the organic EL device by means of an ink jet method as utilized herein is such a method that an ink composition in which a material for forming a pixel is dispersed or dissolved in a solvent is ejected from an ink jet head in order to apply the solvent for the sake of patterning of a hole injection layer and a luminescent layer or the like, In order for ejected ink droplets to be applied for patterning onto a predetermined pixel area with a high accuracy, the separation walls, which are hereinafter referred to as the "banks", are normally provided for sectioning the pixel area.

Active Matrix Substrate

FIG. 1 is a cross sectional view illustrating an example of a basic structure used in manufacturing the organic EL device according to the ink jet method. The substrate 10 made, for example, of glass or the like, is provided thereon with a circuit element section 16 having a transistor 11 and an insulation layer 15. Patterned on the circuit element section 16 is the positive electrode 12. The insulation layer 15 is provided thereon with a wiring 17, which serves to connect the transistor 11 with the positive electrode 12.

Further, an area of the sectioned positive electrode 12 is provided thereon with an inorganic bank 13 composed of $SiO_2$ or the like and an organic bank 14 in a laminated manner. The inorganic bank 13 also takes a roll of avoiding a shortage possibly occurs at a boundary face between the luminescent layer 60 and the organic bank 14. A shape of the organic bank 14, namely, an opening shape of the pixel, may be formed into any shape such as a circular shape, an oval shape or a square shape. If the square shape is employed, it is preferable for the corners of the square shape to have round shapes considering a surface tension of the ink composition. The organic bank 14 may be formed of any material as far as the material has excellent insulation property, heat resistance property, liquid repellent property, ink composition resistance property and sealing property with the base substrate.

The bank is not limited to a multilayer composed of the inorganic layer and the organic layer, as stated above. For example, if the positive electrode 12 is made of ITO, the inorganic bank 13 is preferred to be used in order to obtain a better sealing property with the ITO. A sufficient height of the organic bank 14 is approximately 1 to 2 μm.

Positive Electrode

The positive electrode 12 is formed of a transparent conductive material if the organic EL device is, for example, of a bottom emission type. As for the transparent conductive material, ITO is suitable. However, an amorphous indium zinc oxide transparent conductive film, more specifically, Indium Zinc Oxide which is manufacture by Idemitsu Kosan Co., Ltd. with a trademark of IZO can be used. ITO is employed in the embodiments as the transparent conductive material.

If the organic EL device is of a top emission type, it is not especially required to employ a material having a light transmission property. Alternatively, for example, a reflection layer made of Al can be employed to be provided at a side of a lower layer of the ITO.

Hole Injection Layer

A hole injection layer 40 is preferably made of fluid dispersion of 3,4-polyethylenedioxythiophene/polystyrenesulfonate (PEDOT/PSS) manufactured by Bayern with a product name of Bytron-P, namely, the fluid dispersion in which 3,4-polyethylenedioxythiophene is dispersed in the dispersing medium or polystyrenesulfonate, and the resulting composition is resolved in a polar solvent such as water and isopropyl alcohol.

Luminescent Layer

As for a material for forming an organic semiconductor layer or the luminescent layer 60, a luminescent material capable of emitting luminescence or phosphorescence may be used appropriately.

Materials for the luminescent layer 60 may suitably include, but not limited to, polysilane such as a polyfluorene derivative (PF), poly(para-phenylene vinylene) derivative (PPV), polyfenylene derivative (PP), poly(para-phenylene)

derivative (PPP), polyvinylcarbazole (PVK), polythiophene derivative and poly(methyl phenyl silane) (PMPS). Also, the materials for the luminescent layer 60 may also include the above stated high polymer materials doped with high polymer materials such as perylene dye, coumarin dye and rhodamine dye or low polymer materials such as rubrene, perylene, 9,10-diphenylanthracene, tetraphenyl-butadiene, nile red, coumarin 6, quinacridone and Ir(ppy)$_3$.

Here, the "high polymer" is a polymer having a molecular weight larger than the so-called "low polymer" having several hundred molecular weights. The above stated high polymer materials include polymers of equal to or more than 10,000 molecular weights which are generally referred to as the high polymer as well as low polymers of equal to or less than 10,000 molecular weights which are generally referred to as an oligomer.

According to the embodiment, a luminous wavelength band is formed according to the light's three primary colors for the sake of full color display. In other words, the luminous wavelength band composed of three luminescent layers such as a luminescent layer 60R corresponding to red color, a luminescent layer 60G corresponding to green color and a luminescent layer 60B corresponding to blue color constitutes one pixel. Those luminescent layers emit lights in a gradation manner, thereby enabling the organic EL device in its entirety to provide a full color display.

According to the embodiment, MEHPPV (poly(3-methoxy-6(3-Ethylhexyl)para-phenylene vinylene) is employed to form the luminescent layer 60R for red color, a mixed solution composed of polydioctyl fluorine and F8BT (an alternating copolymer composed of dioctyl fluorine and benzothiadiazole) is employed to form the luminescent layer 60G, and polydioctyl fluorine is employed to form the luminescent layer 60B, respectively. Each of those luminescent layers 60 does not have limit in their thickness but has different suitable thickness color by color. The thickness of each luminescent layer 60 is desirable to have approximately 60 to 120 nm when considering a driving voltage.

Buffer Layer

It is desirable for the buffer layer 70 to be formed into the polymerized film by plasma polymerization using gas material. Thus formed polymerized film has extreme precision. Since a film is formed of a plurality of molecules of a cluster structure in a multilayered manner in a vacuum evaporation method, the resulting film include minute gaps. However, since a film is formed of molecules of a molecule radical structure or an atom radical structure in a depositing manner in plasma polymerization, a film having the extreme precision, less pin holes and high reliability can be formed.

The buffer layer 70 is desirably formed of the polymerized film including fluorocarbon in major proportions in which CHF3 gas is suitably used as the gas material or a starting material. The gas material is not limited to the above described ones but various gas materials can be utilized. For example, CF4, CH4F8, C4F10, C2F4 and C4F8 or the like can also be utilized. The polymerized film made of those gas materials will have an excellent hygroscopic resistant property.

It is desirable that an average thickness of the buffer layer 70 is smaller than 30 Å. If the average thickness of the buffer layer 70 is larger than 30 Å, conductivity of the film in a direction films are layered will remarkably lower while driving voltage of elements will rise.

Electron Injection Layer

Desirable materials for forming an electron injection layer 71 include an organic chemical compound or a low work function metal chemical compound such as alkali metals, alkali earth metals or rare earth metals. If the organic chemical compounds are employed, it is desirable that such compounds have an excellent electron transport property. Furthermore, it is desirable that such compounds have an ionization potential or HOMO (the highest occupied molecular orbital) higher than that of the luminescent layer 60, and an electron affinity or LUMO (the lowest unoccupied molecular orbital) are close to work function of the negative electrode material. If the organic chemical compounds having the above properties would be utilized in forming the electron injection layer 71, a better light emission effect will be expected because of an effect of blocking holes transported from the luminescent layer 60 and an effect of enhancing an electron injection property from the negative electrode 50. More specifically, BCP (bathocuproin) is suitable, and the desirable film thickness, depending on a structure of the element, is between 10 and 50 Å.

Among the low work function metal chemical compounds, LiF (lithium fluoride) is suitably utilized for forming the electron injection layer 71. Here, a desirable thickness of the film is equal to or less than 5 nm. If the thickness of the film becomes larger, the driving voltage will rise. Alternatively, both of the organic chemical compounds and the low work function metal chemical compounds can be utilized. In this case, either way is acceptable that the organic chemical compounds is initially formed to be covered with the low work function metal chemical compound, or that both of the chemical compounds are deposited at the same time with a predetermined ratio or a mixed solution thereof are applied to form the electron injection layer 71. Further alternatively, the organic chemical compounds and the low work function metals such as Cs are deposited at the same time with a predetermined ratio to form the electron injection layer 71.

Negative Electrode

A negative electrode 50 is not limited to any material as far as the material has a conductive property, so that any material, for example, a metal or an alloy may be utilized. When the luminescent layer or the electron injection layer 71 is inserted, the work function of the material for the negative electrode is desired to be close to the LUMO level of the electron injection layer 71. When the work function is larger than the LUMO level of the luminescent layer 60 or the electron injection layer 71, the electron injection barrier becomes larger, and thus the driving voltage rises as well as the light emission efficiency lowers.

More specifically, Ca (calcium) is suitable for the negative electrode. The work function of Ca is small as 2.9 eV and thus the electron injection to the luminescent layer 60 can be done in good condition. However, Ca is apt to be oxidized and is poor in stability, such that a surface of Ca is covered with Al (aluminum) for the sake of protection thereof. Here, a thickness of Ca is 20 nm and a thickness of Al is 20 nm, respectively.

In the case of the top emission type organic EL device, a sufficiently thin negative electrode 50 can be formed into an additional negative electrode having a translucency. Alternatively, the negative electrode 50 can be formed of the conductive material such as ITO having the translucency.

Electronic Equipment

Figure 3:
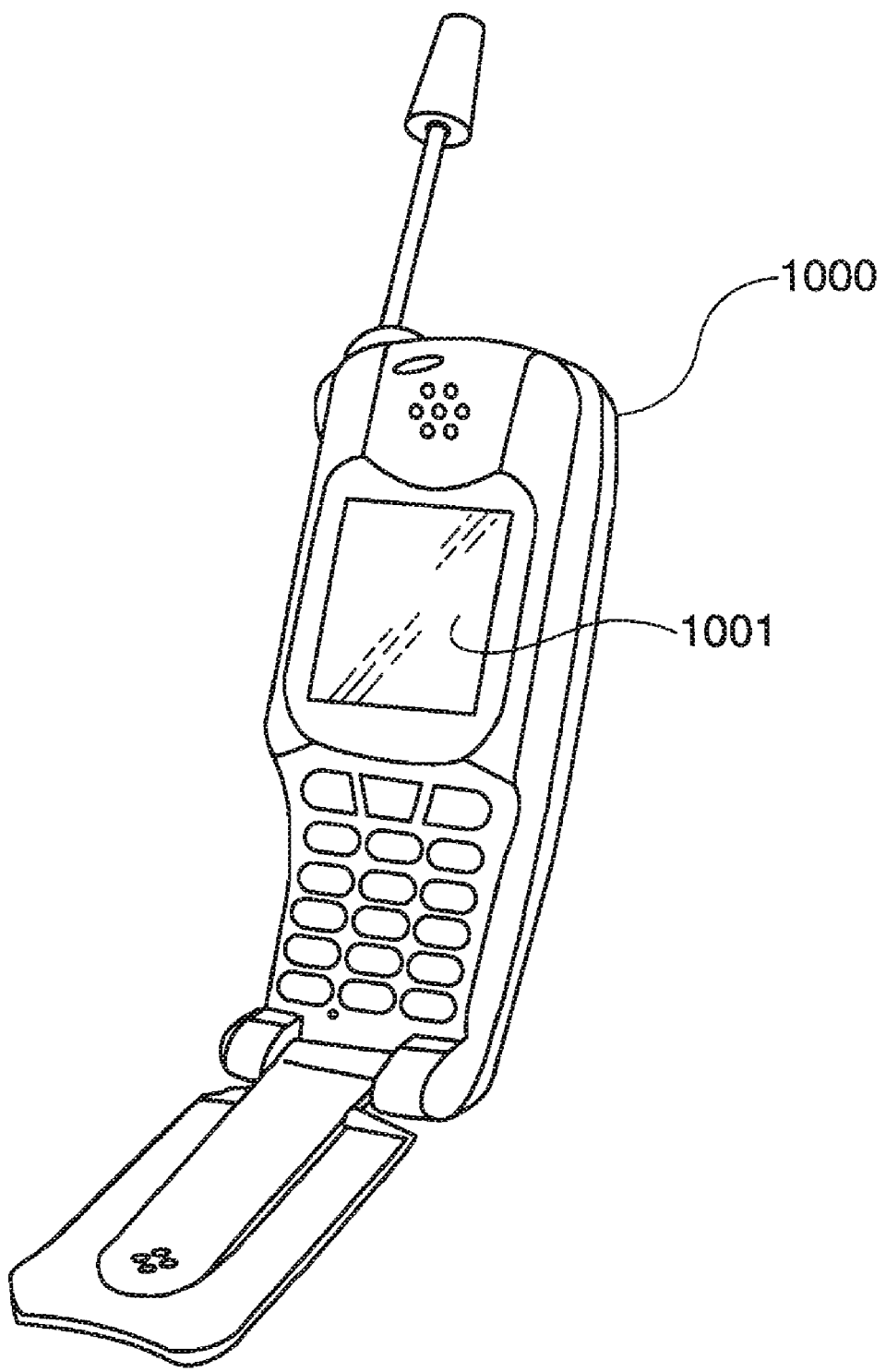
FIG. 3 is a perspective view of a cell phone equipped with the organic EL device according to the embodiments.

An aspect of an electronic equipment of the invention is described hereinafter, referring to FIG. 3. FIG. 3 is a perspective view of a cell phone having the organic EL device according to the embodiments. In FIG. 3, a numeral 1000 denotes a body of the cell phone, and a numeral 1001 denotes a display section of the cell phone, respectively. The cell phone 1000 which is equipped with the display section 1001 having the organic EL device according to the embodiments can demonstrate a good display property.

Method of Manufacturing the Organic EL Device

A method of manufacturing the organic EL device is exemplified hereinafter in view of a cross sectional structure indicative of the manufacturing process step by step, referring to FIG. 2.

Formation of the Hole Injection Layer

Figure 2A:
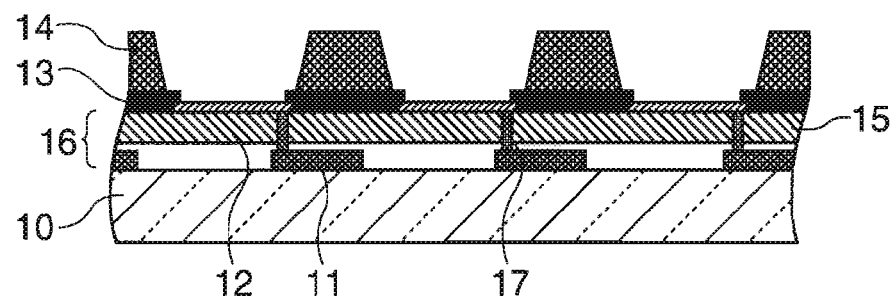
FIGS. 2A to 2F are cross sectional views illustrating manufacturing processes of the organic EL device of FIG. 1.

FIG. 2A is a cross sectional view of a portion of a pixel substrate. Formed on a glass substrate is a pixel electrode made of ITO. The PEDOT/PSS is injected onto a surface of the pixel electrode by an ink jet method to form the hole injection layer 40 having a thickness of 600 Å. Before applying the hole injection layer 40, an organic bank 14 formed, for example, of polyimide is subjected to an ink repellent process by means of an ambient pressure plasma processing. The ambient pressure plasma processing is performed under the ambient pressure, power of 300 W and an electrode-substrate distance of 1 mm. An oxygen plasma processing is performed under an oxygen gas flow amount of 100 m/min., a helium gas flow amount of 10 l/min and a table transportation speed of 10 mm/s. Subsequently, a CF4 plasma processing is performed under a CF4 gas flow amount of 100 ml/min., the helium gas flow amount of 10 l/min. and the table transportation speed of 3 mm/s, in a reciprocating manner.

Figure 2B:
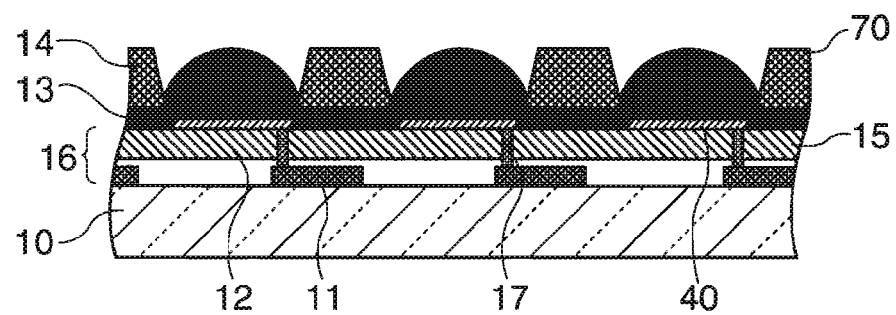

In FIG. 2B, PEDOT/PSS for forming the hole injection layer 40 is added and adjusted with polar solvents such as isopropyl alcohol, N-Methylpyrrolidone, 1,3-Dimethyl-2-imidazolidinone, and thus obtained liquid material is ejected and applied by means of the ink jet method.

Then, the solvent is removed under the conditions in vacuo (1 torr (133.3 Pa)) for 20 minutes at a room temperature, followed by a heating processing within nitrogen at a temperature of 200 (on a hot plate) for 10 minutes. With this method, the hole injection layer 40 having a uniform film thickness can be formed.

Formation of the Luminescent Layer

Figure 2C:
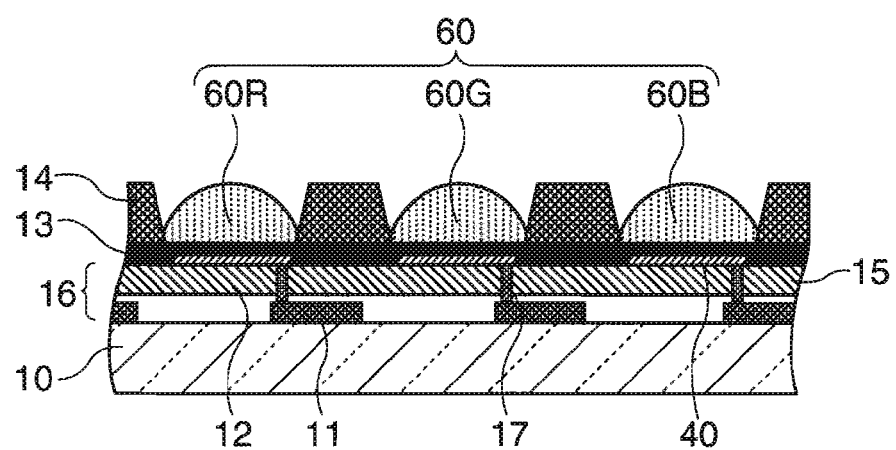

The luminescent layer 60 is formed by means of a luminescent layer forming process as shown in FIG. 2C. In this luminescent layer forming process, a liquid droplet ejecting method or the ink jet method is suitably employed. Namely, a liquid droplet ejecting device or an ink jet device ejects a luminescent layer forming material onto the hole injection layer 40, followed by being subjected to a drying processing and a heating processing in order to form the luminescent layer 60. The luminescent layer forming material utilized in the first embodiment is the mixed solvent composed of the polydioctyl fluorine and the F8BT (the alternating copolymer of dioetyl fluorine and benzothiadiazole).

The formation of the luminescent layer 60 is performed color by color. With the ink jet method, i.e., with the liquid droplet ejecting method, the forming material of the luminescent layer 60 can be placed on a predetermined position, namely, only on the pixel area, in a selective manner. Also, an ejecting amount can be changed at each position.

Formation of the Buffer Layer

Figure 2D:
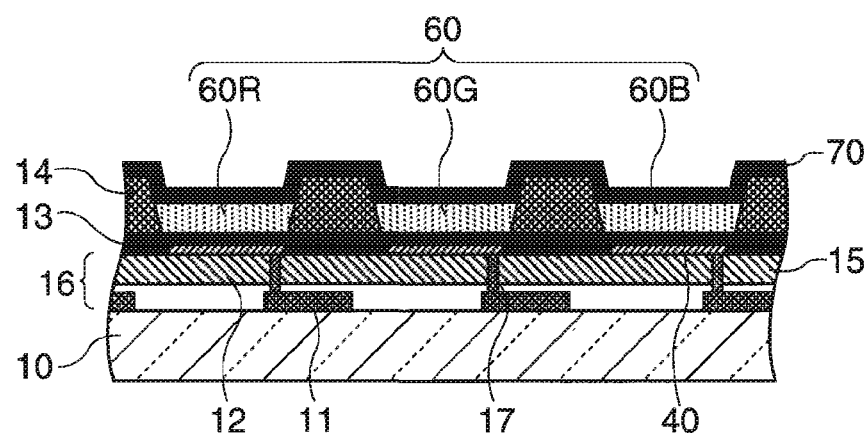

The buffer layer 70 is formed on the luminescent layer in a manner as shown in FIG. 2D. In this buffer layer forming process, plasma polymerization using gas material is employed. Upon employing this method, a good polymerized film is obtainable without inviting deterioration of the luminescent layer by adjusting the conditions of the structure of the device, a frequency of plasma, an output, a flow amount of gas, a processing pressure and a processing time. According to the first embodiment, the method was performed within a chamber equipped with a parallel flat plain type reactor and utilized the CHF3 gas. At first, the inside condition of the chamber is made to be equal to or less than $9 \times 10^{-5}$ Torr. Then the buffer layer 70 is formed under the conditions of the gas flow amount of 50 sccm, a gas pressure of 0.2 Torr, a plasma discharge frequency of 13.56 MHz and a discharging power of 25 W.

Formation of the Electron Injection Layer

Figure 2E:
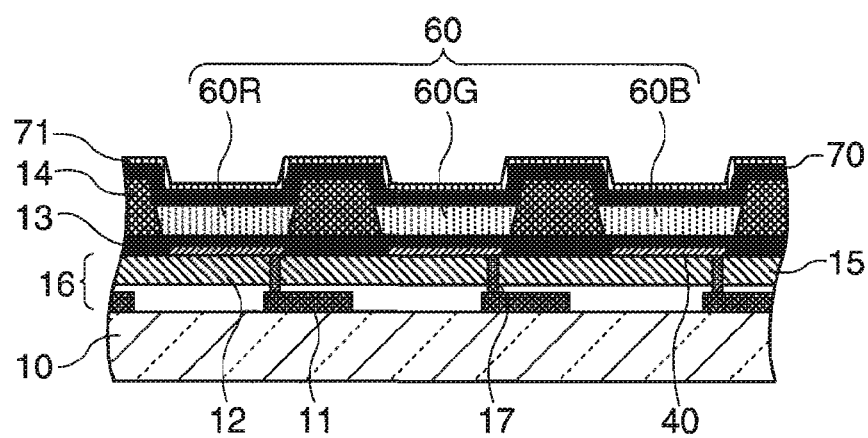

The electron injection layer 71 is formed in a manner as shown in FIG. 2E. The electron injection layer 71 is formed by means of a vacuum evaporation method or an application method. In the embodiment, the LiF is formed by the vacuum evaporation method. The deposition chamber is provided with the substrate which has been made up to the buffer layer 70 and the inside condition thereof is made to be equal to or less than $9 \times 10^{-6}$ Torr. A degree of vacuum at the time of deposition is set to be between $9 \times 10^{-6}$ Torr and $5 \times 10^{-5}$ Torr. A deposition speed is set to be between 0.5 Å/sec and 1.0 Å/sec. Materials and a structure of the electron injection layer 71 changes depending on a kind of the luminescent layer 60. For example, there are the cases that the vacuum deposition is performed with the LiF subsequent to the BCP to form the electron injection layer 71 and that the deposition is performed with the BCP and the Cs with the predetermined ratio at the same time, respectively, to form the electron injection layer 71.

Formation of the Negative Electorode

Figure 2F:
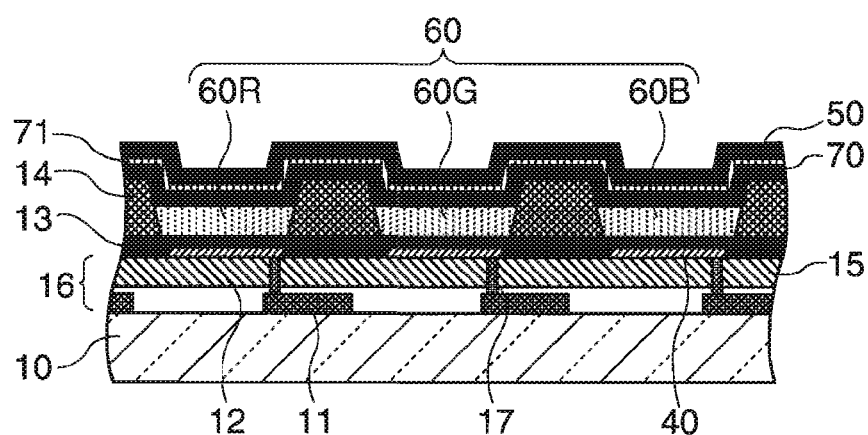

20 Å of Ca and 2000 Å of Al are deposited by means of the vacuum evaporation method in order to form the negative electrode 50 in a manner as shown in FIG. 2F. The negative electrode 50 can be made of any materials as far as those are conductive materials. The negative electrode 50 is made of the Ca and the Al which is widely used as a wiring electrode in a manner they are laminated together. The vacuum evaporation method is used to form the negative electrode 50. The degree of vacuum within the chamber is set to be generally the same degree as that at the time of forming the electron injection layer 71.

Then, the entire surface of the negative electrode 50 is covered and sealed by epoxy resin integral adhesive to form the organic EL device according to the embodiment.

As stated above, the organic EL device according to the embodiment includes the polymerized film or the buffer layer 70 formed by plasma polymerization between the luminescent layer 60 and the negative electrode 50, or between the luminescent layer 60 and the electron injection layer 71. Such structure prevents quenching matters such as ion from the negative electrode 50 or the electron injection layer 71 from diffusing within the luminescent layer 60, thereby contributing to provide the organic EL device having the good stability in driving.

Electronic Equipment

Another aspect of the electronic equipment of the invention is described hereinafter, referring to FIG. 3. FIG. 3 is the perspective view of the cell phone including the organic EL device according to the embodiments. In FIG. 3, the numeral 1000 denotes the body of the cell phone, and the numeral 1001 denotes the display section of the cell phone, respectively. This cell phone 1000 includes the display section 1001 composed of the organic EL device according to the embodiments, such that the cell phone 1000 can demonstrate the good displaying property.

It should be appreciated that the invention is not limited to the above stated embodiments, but can includes various changes, improvements and modifications as far as such changes, improvements and modifications would not depart from the sprit of the invention.

The embodiments of the invention are described hereinafter into more details.

The First Example

A pixel electrode made of ITO was formed on a surface of the glass substrate and then the hole injection layer was formed thereon by applying the PEDOT/PSS for 600 Å. The luminescent layer was further formed on a surface of the hole injection layer, using the mixed solution of the polydioctyl fluorine and F8BT (the alternating copolymer of dioctyl fluorine and benzothiadiazole). Further, a negative electrode buffer layer was formed on a surface of the luminescent layer. The negative electrode buffer layer was formed by means of plasma polymerization. A formation of the polymerized film was performed within the chamber equipped with the parallel flat plain type reactor, using the CHF3 gas. Firstly, an inside of the chamber was set to be equal to or less than $9 \times 10^{-5}$ Torr. Secondly, the polymerized film of 10 Å was formed under the conditions of 50 sccm of the gas flow amount, 0.2 Torr of the pressure, 13.56 MHz of the plasma discharge frequency and 25 W of the discharging power.

Thirdly, the negative electrode was formed with 20 Å of Ca and 2000 Å of Al by means of the vacuum evaporation method.

Finally, the entirety of the substate was sealed with the sealing substrate.

The Second Example

The forming processes from the ITO to the luminescent layer 60 were performed in a similar manner to the first embodiment. The surface of the luminescent layer 60 was provided with the buffer layer 70 by 30 Å under the same conditions as the first embodiment.

Provided with the surface of the luminescent layer 60 was the negative electrode 50 composed of 200 Å of Ca and 2000 Å of Al by the vacuum evaporation method.

Then, the entirety of the substrate was sealed with the sealing substrate.

The First Comparison

The forming processes from the ITO to the luminescent layer 60 were performed in a similar manner to the first embodiment. The surface of the luminescent layer 60 was provided with the negative electrode 50 composed of 200 Å of Ca and 2000 Å of Al by the vacuum evaporation method.

Then, the entirety of the substrate was sealed with the sealing substrate.

Element Characteristic

Figure 4A:
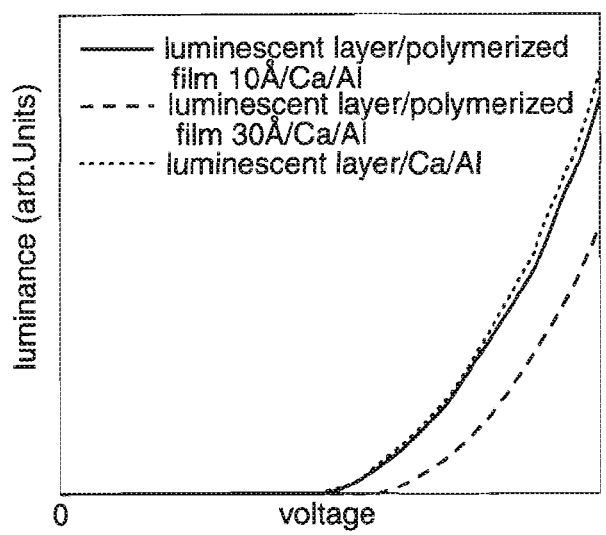
FIGS. 4A to 4C are charts showing a property of the organic EL device in view of the first and a second embodiments and a first comparison example.
Figure 4B:
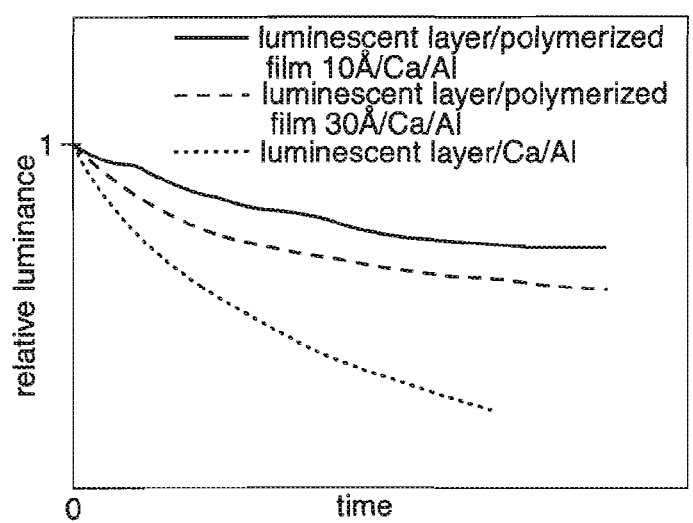
Figure 4C:
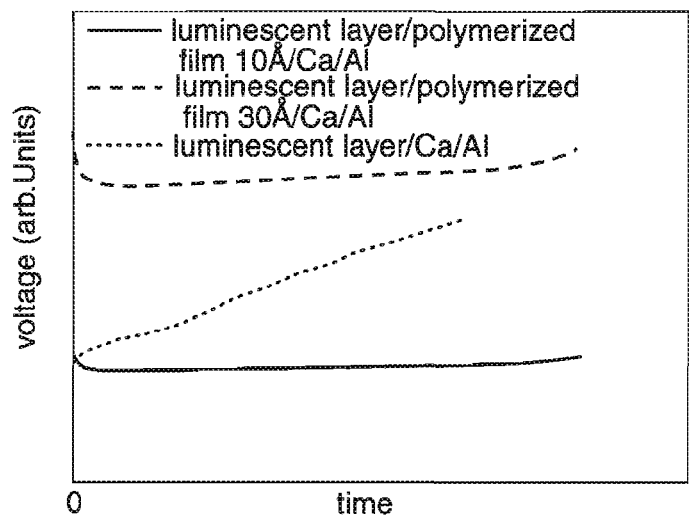

In thus formed organic EL device, a direct-current voltage is applied between the ITO or the positive electrode 12 and the Al or the negative electrode 50 to measure an luminance of light emission and a current value. FIG. 4A shows a luminance-voltage characteristic. FIG. 4B shows a change of the luminance with respect to time under the condition that the current value is kept constant when the luminance is set to a predetermined value. FIG. 4C shows a change of the voltage with respect to time. Here, a relative luminance is a luminance ratio at a certain time with respect to an initial luminance.

The Third Example

The forming processes from the ITO to the luminescent layer 60 were performed in a similar manner to the first embodiment. The surface of the luminescent layer 60 was provided with the buffer layer 70 by 10 Å under the same conditions as the first embodiment.

Provided with the surface of the luminescent layer 60 was the electron injection layer 71 composed of 20 Å of LiF and 2000 Å of Al by the vacuum evaporation method.

Then, the entirety of the substrate was sealed with the sealing substrate.

The Second Comparison

The forming processes from the ITO to the luminescent layer 60 were performed in a similar manner to the first embodiment. The surface of the luminescent layer 60 was provided with the buffer layer 70 by 10 Å under the same conditions as the first embodiment.

Further, provided with the surface of the luminescent layer 60 was the electron injection layer 71 composed of 20 Å of LiF and 2000 Å of Al by the vacuum evaporation method.

Element Characteristic

Figure 5A:
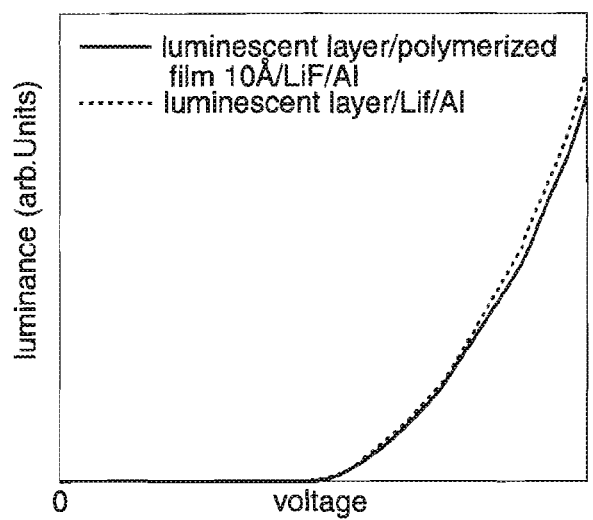
FIGS. 5A to 5C are charts showing a property of the organic EL device in view of a third embodiment and a second comparison example.
Figure 5B:
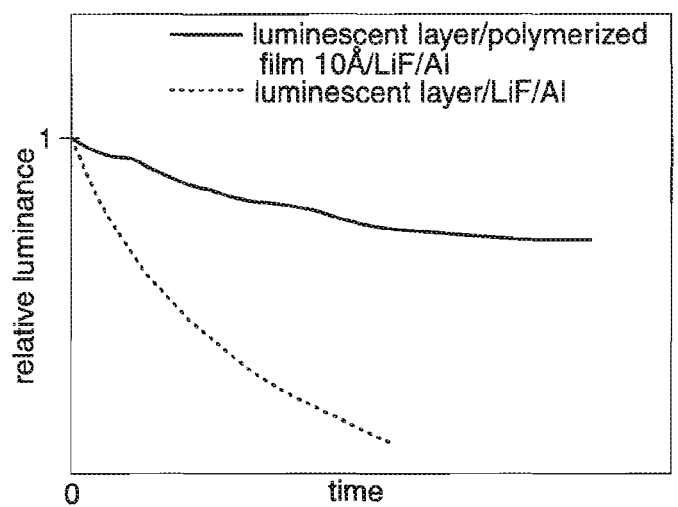
Figure 5C:
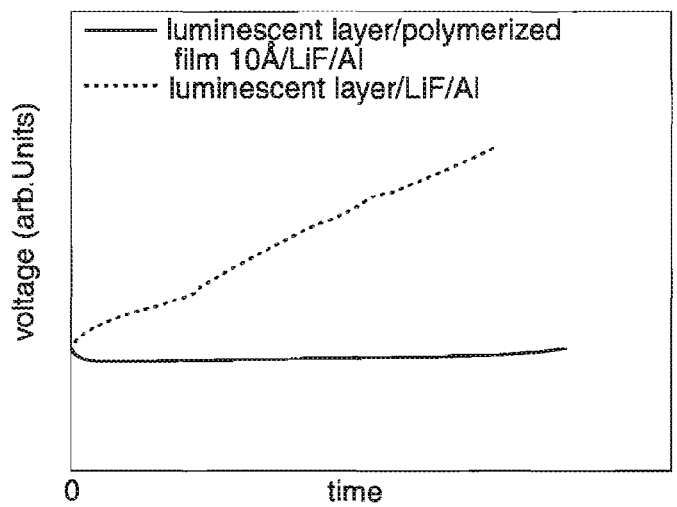

In thus formed organic EL device, the direct-current voltage is applied between the ITO or the positive electrode 12 and the Al or the negative electrode 50 to measure the luminance of light emission and the current value. FIG. 5A shows the luminance-voltage characteristic. FIG. 5B shows the change of the luminance with respect to time under the condition that the current value is kept constant when the luminance is set to the predetermined value. FIG. 5C shows the change of the voltage with respect to time. Here, a relative luminance is a luminance ratio at a certain time with respect to an initial luminance.

The Fourth Example

The forming processes from the ITO to the hole injection layer 71 were performed in a similar manner to the first embodiment. The hole injection layer 71 was provided thereon with the luminescent layer 60, using the solution in which PVK (polyvinylcarbazole) and ir(ppy)$_3$ were mixed at a weight ratio of 97:3. The buffer layer 70 was formed on the surface of the luminescent layer for 10 Å under the conditions identical to those of the first embodiment.

Further, the electron injection layer 71 composed of BCP and Cs was formed on the surface of the buffer layer 70 by the coevaporation method. Deposition rate was adjusted to allow a molar ratio of the BCP and the Cs to show approximately 1:1. The negative electrode 50 composed of 2000 Å of Al was further formed thereon by the vacuum evaporation method.

Finally, the entirety of the substrate was sealed with the sealing substrate.

The Third Comparison

The forming processes from the ITO to the luminescent layer 60 were performed in a similar manner to the first embodiment.

Further, the electron injection layer 71 composed of the BCP and the Cs was formed on the surface of the luminescent layer 60 by coevaporation method. The deposition rate was adjusted to allow the molar ratio of the BCP and the Cs to show approximately 1:1. The negative electrode composed of 2000 Å of Al was further formed thereon by the vacuum evaporation method.

Then, the entirety of the substrate was sealed with the sealing substrate.

Element Characteristic

Figure 6A:
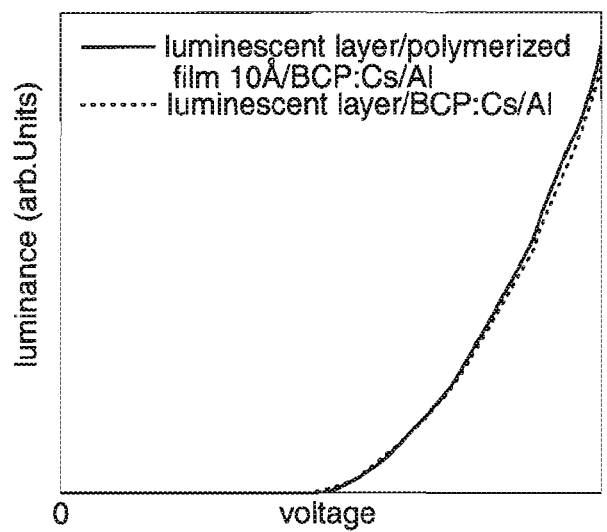
FIGS. 6A to 6C are charts showing a property of the organic EL device in view of a fourth embodiment and a third comparison example.
Figure 6B:
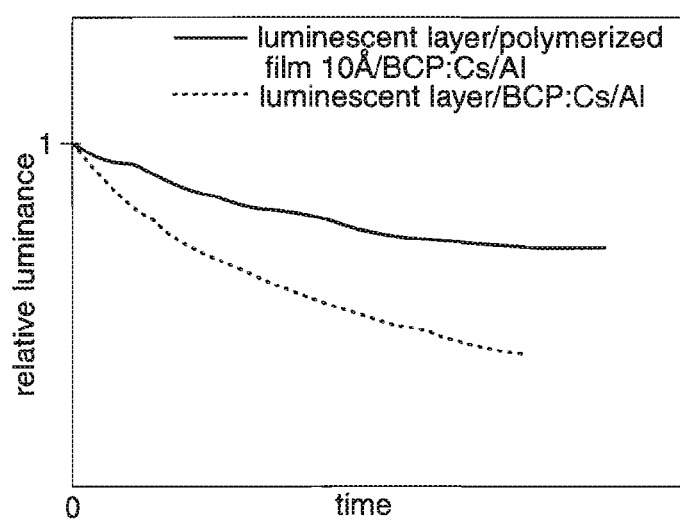
Figure 6C:
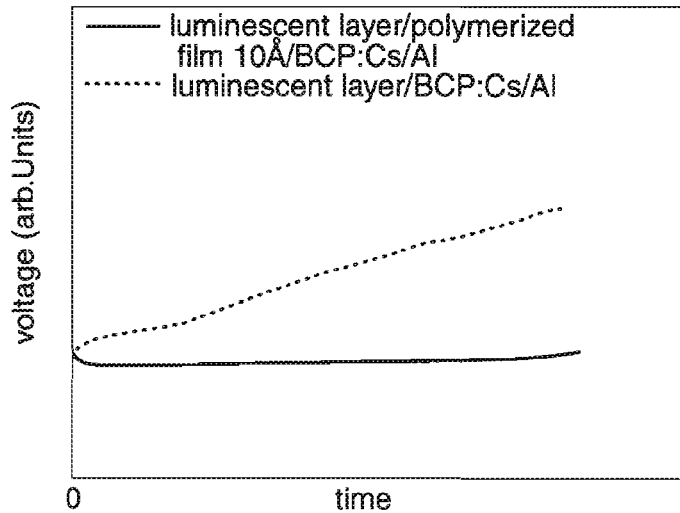

In thus formed organic EL device, the direct-current voltage was applied between the ITO or the positive electrode 12 and the Al or the negative electrode 50 to measure the luminance of light emission and the current value, FIG. 6A shows the luminance-voltage characteristic. FIG. 6B shows the change of the luminance with respect to time under the condition that the current value is kept constant when the luminance is set to a predetermined value. FIG. 6C shows the change of the voltage with respect to time. Here, a relative luminance is a luminance ratio at a certain time with respect to an initial luminance.

It should be appreciated that the invention is not limited to the above described embodiments, but can be practiced with various modifications and changes thereto as far as such modifications and changes would not depart from the spirit of the invention.

What is claimed is:

1. An electroluminescence device comprising:

a positive electrode;

a negative electrode;

a plurality of luminescent layers disposed between the positive electrode and the negative electrode and separated from one another by a bank; and a buffer layer disposed between the luminescent layer and the negative electrode, the buffer layer being formed continuously across all of the luminescent layers and formed of a plasma polymerized film made of gas material and having an average thickness of equal to or less than 30 Å.

2. The electroluminescence device according to claim 1, further comprising an electron injection layer between the negative electrode and the buffer layer.

3. The electroluminescense device according to claim 2, wherein the buffer layer is in contact with the electron injection layer.

4. The electroluminescence device according to claim 1, wherein the buffer layer includes fluorocarbon.

5. An electronic equipment comprising the electroluminescence device according to claim 1.

6. The electroluminescence device according to claim 1, wherein the buffer layer is in contact with the negative electrode.

* * * * *